(12) United States Patent
Hillier et al.

(10) Patent No.: US 11,692,879 B2
(45) Date of Patent: Jul. 4, 2023

(54) METHOD AND DEVICE FOR MEASURING A PULSE SIGNAL WITH HIGH DYNAMIC RANGE

(71) Applicant: The Secretary of State for Defence, London (GB)

(72) Inventors: David Lanto Hillier, Reading (GB); David Norman Winter, Reading (GB)

(73) Assignee: The Secretary of State for Defence, London (GB)

( * ) Notice: Subject to any disclaimer, the term of this patent is extended or adjusted under 35 U.S.C. 154(b) by 0 days.

(21) Appl. No.: 17/427,899

(22) PCT Filed: Feb. 18, 2020

(86) PCT No.: PCT/GB2020/000016
§ 371 (c)(1),
(2) Date: Aug. 2, 2021

(87) PCT Pub. No.: WO2020/169941
PCT Pub. Date: Aug. 27, 2020

(65) Prior Publication Data
US 2022/0107224 A1 Apr. 7, 2022

(30) Foreign Application Priority Data

Feb. 18, 2019 (GB) .................................... 1902183

(51) Int. Cl.
*G01J 11/00* (2006.01)
*G01R 29/02* (2006.01)

(52) U.S. Cl.
CPC .............. *G01J 11/00* (2013.01); *G01R 29/02* (2013.01)

(58) Field of Classification Search
CPC .................................. G01J 11/00; G01R 29/02
USPC ........................ 356/450, 213–235; 342/375; 324/476.12, 710, 76.77, 76.12; 398/161, 398/102
See application file for complete search history.

(56) References Cited

U.S. PATENT DOCUMENTS 5,184,243 A * 2/1993 Henmi ................. H04B 10/548
398/191
5,831,752 A * 11/1998 Cotter ................... H04L 7/0075
398/155

(Continued)

FOREIGN PATENT DOCUMENTS

| GB | 2547486 A | 8/2017 |
| JP | H0694843 A | 4/1994 |
| JP | 2008292937 A | 12/2008 |

OTHER PUBLICATIONS

International Patent Application No. PCT/GB2020/000016, International Search Report and Written Opinion, dated May 25, 2020.

(Continued)

*Primary Examiner* — Isiaka O Akanbi
(74) *Attorney, Agent, or Firm* — Kilpatrick Townsend & Stockton LLP

(57) ABSTRACT

The invention relates to devices and methods of characterising a single unknown pulse signal. They create multiple replica of the original that may be more reliably measured, by dividing the signal through nodes and using different signal pathways that may apply a temporal delay. The device and methods have multiple fields of application, most notably with the internal confinement fusion industry.

20 Claims, 3 Drawing Sheets

(56) References Cited

U.S. PATENT DOCUMENTS

| | | | | |
|---|---|---|---|---|
| 5,861,965 | A | * | 1/1999 | Koren ................ H04B 10/272 398/71 |
| 6,023,360 | A | * | 2/2000 | Morioka ............ H04Q 11/0005 398/1 |
| RE37,561 | E | * | 2/2002 | Li ............................ G01S 13/87 367/149 |
| 2003/0128923 | A1 | * | 7/2003 | Takiguchi ............ H04B 10/508 385/27 |
| 2004/0202471 | A1 | * | 10/2004 | Bethea .................... H04J 14/08 398/53 |
| 2005/0053329 | A1 | * | 3/2005 | Shahar ................. G02B 6/2861 385/27 |
| 2007/0286604 | A1 | | 12/2007 | Patissou et al. |
| 2009/0072811 | A1 | | 3/2009 | Marciante et al. |
| 2011/0077887 | A1 | * | 3/2011 | Ito ........................ G01J 3/2889 702/77 |
| 2013/0315590 | A1 | | 11/2013 | Zhou |
| 2014/0341565 | A1 | | 11/2014 | Jolly et al. |
| 2019/0120696 | A1 | * | 4/2019 | Wong ........................ G01J 9/00 |

OTHER PUBLICATIONS

Michael Mueller et al., "12 MJ Pulse Energy 8-Channel Divided-Pulse Ultrafast Fiber-Laser System", SPIE—International Society for Optical Engineering, vol. 10083, Feb. 22, 2017, p. 1008302, XP055692797.

United Kingdom Patent Application No. GB1902183.1, Search Report, dated Aug. 15, 2019.

United Kingdom Patent Application No. GB2002126.7 Combined Search and Examination Report, dated Jul. 3, 2020.

United Kingdom Patent Application No. 2002126.7 Intention to Grant, dated Oct. 18, 2021.

United Kingdom Patent Application No. 2002126.7 Examination Report, dated Sep. 16, 2021.

Japanese Patent Application No. JP 2021-548620, Office Action dated Mar. 22, 2022, 6 pages.

Chinese Patent Application No. 202080014789.X, Office Action dated Aug. 29, 2022, 11 pages.

\* cited by examiner

METHOD AND DEVICE FOR MEASURING A PULSE SIGNAL WITH HIGH DYNAMIC RANGE

This invention generally relates to apparatus and methods for the measurement of uncharacterised single pulse emissions, in particular for adjusting the unknown amplitude characteristics of single pulse emissions to match the measurement range of the measuring equipment.

There are many fields that require the temporal profile of a pulse signal to be measured. Nanosecond and sub nanosecond length pulses are used in a variety of applications including but not limited to LIDAR, remote sensing, and laser-based inertial confinement fusion (ICF). It is advantageous to be able to accurately measure the pulse shape of high contrast laser pulses used in ICF.

In known measurement techniques, a pulse illuminates a sensor, be that a photodiode, photomultiplier or other device generating a time varying voltage which is proportional to the incident power of the pulse. This time varying voltage is then recorded on an oscilloscope giving a representation of the time resolved power of the pulse.

Using a photodiode or similar device works well if the peak power of the incident pulse is known. In such instances the pulse can be attenuated such that it sits in the middle of the dynamic range of the photodiode and oscilloscope and a high-fidelity measurement can be made. However, if the power is not known then the signal amplitude may be too weak to measure accurately or too high and therefore saturate the detector or oscilloscope.

For repetitive signals the attenuation can be varied until an appropriate signal level is reached. With a single shot measurement however, an estimate must be made of the signal level. This makes an unknown pulse very hard to measure accurately.

Various methods of enhancing the dynamic range and or resolution of photodiode-oscilloscope based systems have been developed.

Some known devices generate a sequence of pulses of varying magnitudes and each pulse is converted into a chain of pulses of decreasing intensity using a fibre loop ring cavity. The disadvantage of this is that if the first pulse of the chain saturates the detector no further information can be retrieved from the subsequent pulses.

A known device describes a single shot optical sampling oscilloscope. A fibre loop ring cavity with an active gain medium inside it converts a single pulse into a chain of pulses of increasing energy. These pulses then interact with pulses generated by a second, phase locked source to generate a third signal which is digitised and analysed. This device is very complicated and doesn't help with saturation effects that the enclosed invention seeks to address.

A known method is to convert the pulse into an electrical signal using a photo diode and subsequently splitting this electrical signal between multiple oscilloscope channels each set to a different voltage range.

This technique can also be applied optically where the incident optical pulse is split into a number of identical (or none identical) pulses each of which is sent to its own photodiode and oscilloscope channel.

Splitting the signal between multiple detectors has the disadvantage that it uses many oscilloscope channels and detectors to measure a single signal.

US 2009/0072811 discloses a scheme where a laser pulse is split by optical fibres into a chain of 256 identical replicas. These are then measured by photo diodes and statistical averaging techniques are used to generate a higher fidelity measurement of the input pulse shape than would be generated from a single measurement.

This technique gives a high-fidelity measurement of the laser pulse but still has a limited dynamic range. Should the incident laser power rise unexpectedly and the photodiode become saturated or the voltage range of the oscilloscope be exceeded no data will be retrieved.

If a detector receives a signal which is larger than it can cope with it saturates and requires time to recover. The harder the detector is impacted by an incident signal the longer it takes to recover so any signal that follows can be swamped. In the case of a ring down signal (such as those generated by a fibre loop cavity) or a series of identical pulses if the first signal is greater than the detector can cope with it is no longer possible to get any useful data from any of the replicas. FIG. 2 illustrates four replicas of decreasing magnitude. FIG. 3 illustrates saturated signals.

It is an object of the invention to overcome at least some of these issues and provide a device and method for reliably recording the characteristics of a single uncharacterised pulse signal.

According to a first aspect of the invention there is provided a pulse replication device for passively converting a single uncharacterised pulse signal into a chain of replica pulse signals, of which at least one will be within a predetermined amplitude threshold range comprising:

An input node for receiving an incident pulse signal arranged to divide the incident pulse signal between a first and a second signal pathway;

the first signal pathway configured to apply a first temporal delay with respect to the second signal pathway;

an output node arranged to, combine the pulse signals from the first and the second signal pathway into a single signal pulse train;

wherein the input node is configured to divide the pulse signal along the first and the second signal pathways so that the amplitude characteristics of the pulse signal passing along the first signal pathway are different to the amplitude characteristics of the pulse signal passing along the second signal pathway such that the output node receives temporally separated pulse signals of increasing amplitude intensity.

Advantageously this device allows the user to create multiple time separated replications of the single input signal with successively increased amplitude profiles ensuring that at least one of the replications will have amplitude characteristics that will be within the set threshold of the measuring oscilloscope. This provides a reliable, passive and simple device to permit measuring of an uncharacterised single shot pulse signal.

For a series of pulses of increasing magnitude, the first pulse is the weakest so is the least likely to saturate your detector. If a chain of pulses of increasing magnitude hits the detector by the time a pulse that can saturate the detector hits it all of the previous signals should have been measurable.

Advantageously the device allows the extension of the measurement range of an analogue to digital convertor for measuring a single pulse event.

Optionally the pulse replication device comprises at least one intermediate node arranged to intersect the first and second signal pathway and; the first or the second signal pathway is configured to apply at least a second temporal delay.

Optionally the at least one intermediate node is configured to divide the pulse signal so that the amplitude characteristics of the pulse signals passing along the first signal pathway are different to the amplitude characteristics of the pulse signals passing along the second signal pathway.

By further dividing the signals unequally with a further time delay, it provides for more graduated steps in the amplitude of the pulse signal, further ensuring that one of the pulses will be within the predetermined threshold range.

Optionally the pulse signal is an optical pulse signal. Advantageously being able to characterise optical pulses provides for a broad spectrum of applications for such a device.

Optionally the pulse signal is a laser pulse signal. Advantageously, characterisation of laser pulses has many applications, notably within the Inertial Confinement Fusion process, plasma physics and laser machining industries.

Optionally the pulse signal comprises an electrical signal. The device has scope to be exploited within the electrical signal processing field. It would allow test and characterisation of the outputs from a variety of electronic emissions.

Optionally the device may comprise a measuring apparatus configured to receive the signal pulse train.

Optionally the measuring apparatus is an oscilloscope.

Advantageously, this allows for a single device capable of receiving a temporal single unknown pulse signal, measure its characteristics without risk of the signal saturating the device or not registering and displaying the pulse characteristics to the user.

According to a second aspect of the invention there is provided a method of passively optimising a single uncharacterised pulse signal into a chain of pulse signal replicas, of which, at least one of the pulse signal replicas will be within a predetermined amplitude threshold range comprising the steps of:

a) Receiving a pulse signal to be measured;
b) Dividing the uncharacterised pulse signal into at least two separate pulse signals; each having different amplitude characteristics.
c) Applying a temporal delay to one of the separate pulse signals.
d) Combining the separate pulse signals into a consolidated signal train.

The steps of this method advantageously describe a process which if followed allows the reliable capture and measurement of an un-characterised single pulse signal using simple commercially available equipment.

Optionally the method comprises the further step of sending the consolidated signal train to a measuring apparatus. This allows for immediate characterisation of the original pulse signal.

Optionally the method can be used on an optical pulse. Advantageously being able to characterise optical pulses provides for a broad spectrum of applications for such a device.

Optionally the method can be used on a laser pulse. Advantageously, characterisation of laser pulses has many applications, notably within the Inertial Confinement Fusion process, plasma physics and laser machining industries.

Optionally the method can be used on an electrical pulse. The method has scope to be exploited within the electrical signal processing field. It would allow test and characterisation of the outputs from a variety of electronic emissions.

Optionally the method when used on electrical pulses can comprise the step of converting the electrical pulse into an optical pulse. This allows an electrical pulse to be characterised with the high bandwidth available from optical fibres.

One specific embodiment of the device will now be described by way of example only and with reference to the enclosed figures.

The device itself may consist of series of nodes e.g. optical couplers, fibre optic couplers (or bulk beam splitters) and delay lines as shown in the FIGURE below.

Figure 1:
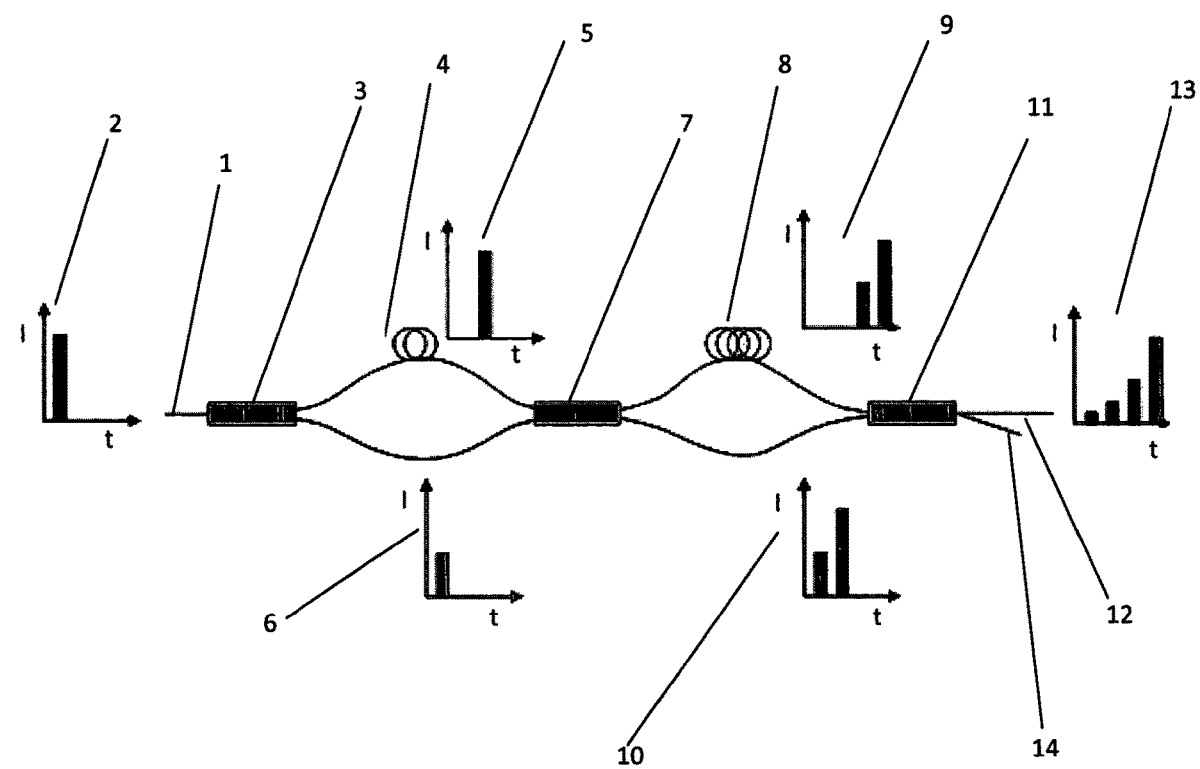
FIG. 1 shows a schematic of a pulse replicator designed to produce four replicas of a laser pulse
Figure 2:
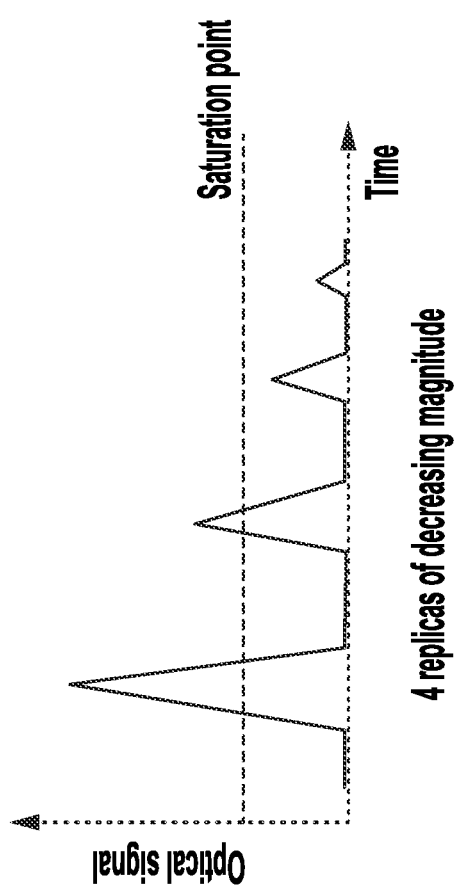
FIG. 2 illustrates four replicas of decreasing magnitude.
Figure 3:
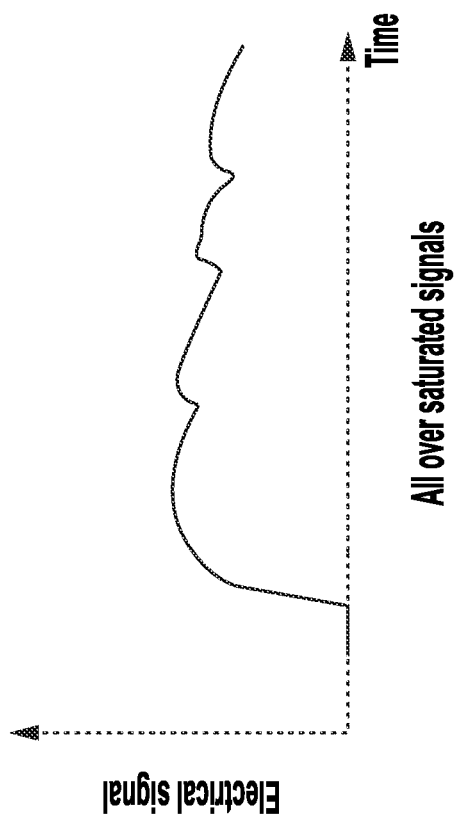
FIG. 3 illustrates saturated signals.

FIG. 1 shows a schematic of a pulse replicator designed to produce four replicas of a laser pulse. The incident pulse (1) with unknown characteristics (2) in terms of amplitude and temporal profile, enters a first node (3) and is split into two pulses of differing amplitude and sent along at least two separate signal pathways formed from fibre optic pathways. The most intense pulse (5) is delayed by a time 't' (4) before being passed to the second node (7). The other, weaker, pulse (6) passes directly to the second node (7). At the second node (7) some of the light from each of the signals is sent to each further output. The amount of light that propagates to each output is determined by the coupling ratio of the node (7). One of these outputs with characteristics (5&6) is passed directly to a third node (11) and the other output (8) is delayed, this time by a time '2*t' and has the characteristics (9). These two outputs are combined in a third coupler (11) where the coupling ratio is selected such that the signal leaving from the first node output (12) consists of a chain of four pulses each of increasing intensity (13). This chain of pulses is then sent to a measuring device (not shown). Any residual light from the device leaves via the other arm of the node (14).

It is to be noted that the features disclosed in FIG. 1 provide an exemplary design including an intermediate node between the input node (3) and the output (11), in its most broad form the invention does not require intermediate nodes or the associated pathways between the intermediate node (7) and the output node (11). For clarity, the terms: input node (3) is also referred to as the first node, the intermediate node (7) as the second node and the output node (11) as the third node or coupler.

By judicious selection of the coupling ratios through the replication stages, at the output (12) a series of time separated replicas (13) of the incident pulse (1) is created with increasing intensity. In order to generate a series of four exponentially increasing pulses each 'n' times more intense than the previous one the splitting ratios should be set to values set below.

| COMPONENT | SPLITTING RATIO |
| --- | --- |
| NODE 1 | 1:n |
| NODE 2 | 1:1 |
| NODE 3 | 1:n^2 |

The series of separated replica (13) pulses termed a signal pulse train is then converted to an electrical signal using a photodiode (not shown) and recorded on an oscilloscope (not shown). Thus, the effective dynamic range of the measuring device is extended by ratio of the intensity of the first to last pulse replica. Through this method of generating time separated replicas with an increasing intensity characteristic it is assured that at least one of pulses will be within the dynamic range of the measuring instrument such as an oscilloscope improving the reliability of recording the original pulse with unknown temporal characteristics. It also ensures that the measurement device has not been blinded or saturated by an early high intensity pulse.

It will be understood by those skilled in the art that the optical couplers may have a dual function of both coupling received signals and then further dividing the signal further. They are also often alternatively referred to in the art as optical taps or splitters.

Furthermore, whilst this specific embodiment describes the replication of an optical signal it is to be appreciated that this method is similarly applicable to electrical signals and may comprise power dividers or directional couplers.

Depending upon the type and characteristics of the pulse signal to be processed, the fibre optic paths may be replaced by any suitable transmission path such as an electrical pathway.

The invention claimed is:

1. A passive pulse replication device for passively converting a single uncharacterized pulse signal into a chain of replica pulse signals, the passive pulse replication device comprising:
   a plurality of fully optical nodes capable of replicating the single uncharacterized pulse signal, wherein the plurality of fully optical nodes are arranged to operate successively upon the single uncharacterized pulse signal, the plurality of fully optical nodes comprising:
      an input node configured to:
         receive the single uncharacterized pulse signal; and
         divide the single uncharacterized pulse signal into a first pulse signal following a first signal pathway and a second pulse signal following a second signal pathway such that first amplitude characteristics of the first pulse signal passing along the first signal pathway are different to second amplitude characteristics of the second pulse signal passing along the second signal pathway, the first signal pathway configured to apply a first temporal delay to the first pulse signal with respect to the second pulse signal; and
      an output node configured to combine the first and second pulse signals from the first and the second signal pathway into a single signal pulse train comprising time-separated replications of the single uncharacterized pulse signal, wherein successive replications have exponentially increasing amplitude characteristics relative to each other.

2. A device according to claim 1, wherein the plurality of fully optical nodes comprise at least one intermediate node arranged to intersect the first and second signal pathway and divide the first pulse signal and the second pulse signal, wherein the first or the second signal pathway is configured to apply a second temporal delay to part of the divided signal, wherein the second temporal delay is greater than the first temporal delay.

3. A device according to claim 2, wherein the at least one intermediate node is configured to further divide the uncharacterized pulse signal so that the amplitude characteristics of the first pulse signal passing along the first signal pathway and the second pulse signal passing along the second signal pathway are further varied with respect to each other.

4. A device according to claim 2, wherein the at least one intermediate node is configured to divide the first pulse signal and the second pulse signal according to a coupling ratio of 1:n or $1:n^2$, where n is a desired increase of the amplitude characteristics between pulses.

5. A device according to claim 1, wherein the single uncharacterized pulse signal comprises an optical pulse signal.

6. A device according to claim 5, wherein the single uncharacterized pulse signal comprises a laser pulse signal.

7. A device according to claim 1, wherein the single uncharacterized pulse signal comprises an electrical signal.

8. A device according to claim 1, comprising a measuring apparatus configured to receive the single signal pulse train.

9. A device according to claim 8, wherein the measuring apparatus is an oscilloscope.

10. A device according to claim 1 further comprising at least one or more further successive node, a quantity of replica pulse signals being exponentially proportional to a number of successive nodes.

11. A device according to claim 1, wherein the input node is configured to divide the single uncharacterized pulse signal such that so that the amplitude characteristics of the first pulse signal passing along the first signal pathway are substantially exponentially different to the amplitude characteristics of the second pulse signal passing along the second signal pathway.

12. A method of passively optimizing a single uncharacterized pulse signal into a chain of pulse signal replicas using a pulse replication device, of which, wherein at least one of the pulse signal replicas will be within a predetermined amplitude threshold range, the method comprising:
   a) receiving, at an input node of the pulse replication device, a pulse signal to be measured;
   b) dividing, at the pulse replication device, the single uncharacterized pulse signal into a first pulse signal on a first separate signal pathway and a second pulse signal on a second separate signal pathway of the pulse replication device, wherein;
   c) applying, at the pulse replication device, a temporal delay to one of the separate pulse signals; and
   d) combining, at an output node of the pulse replication device, the separate pulse signals into a consolidated signal train comprising time-separated pulses of exponentially increasing intensity relative to each other.

13. A method according to claim 12, further comprising sending the consolidated signal train to a measuring apparatus.

14. A method according to claim 12, wherein the received pulse signal comprises an optical pulse.

15. A method according to claim 12, wherein the received pulse signal comprises a laser pulse.

16. A method according to claim 12, wherein the received pulse signal comprises an electrical pulse.

17. A method according to claim 16 further comprising converting the electrical pulse into an optical pulse.

18. A passive pulse replication device for passively converting a single uncharacterized pulse signal into a chain of replica pulse signals, the passive pulse replication device comprising a plurality of fully optical nodes capable of replicating the single uncharacterized pulse signal and arranged to operate successively upon the single uncharacterized pulse signal, wherein a first node of the plurality of fully optical nodes is configured to:
   divide, according to a first coupling ratio, the single uncharacterized pulse signal into a first signal and a second signal;
   delay, according to a first delay, the first signal;
   recombine the delayed first signal and the second signal into a combined signal; and
   output the combined signal to a second node of the plurality of fully optical nodes, wherein the second node is configured to:
  receive the combined signal from the first node;
  divide, according to a second coupling ratio that is different from the first coupling ratio, the combined signal into a third signal and fourth signal;
  delay, according to a second delay, the third signal; and
  recombine the delayed third signal and the fourth signal into an output signal, wherein the output signal comprises time separated replications of the single uncharacterized pulse signal, the replications having successively increased amplitude relative to one another.

19. A passive pulse replication device according to claim 18, wherein the first coupling ratio and the second coupling ratio are selected from 1:n, 1:1, and $1:n^2$, where n is a desired increase of the amplitudes between replications.

20. A passive pulse replication device according to claim 18, wherein the second delay is different from the first delay.

\* \* \* \* \*